United States Patent [19]

Battarel

[11] 3,997,885
[45] Dec. 14, 1976

[54] REGISTER FOR THE PROPAGATION OF MAGNETIC DOMAINS IN THIN MAGNETIC LAYERS

[75] Inventor: Claude Battarel, Magagnosc, France

[73] Assignee: TECSI (Techniques et Systemes Information), Paris, France

[22] Filed: Mar. 7, 1975

[21] Appl. No.: 556,523

[30] Foreign Application Priority Data

Mar. 8, 1974 France .............................. 74.08011

[52] U.S. Cl. .................. 340/174 ZB; 340/174 FB; 340/174 SR; 340/174 TF
[51] Int. Cl.[2] .................. G11C 19/00; G11C 11/14
[58] Field of Search .............. 340/174 FB, 174 MC, 340/174 TF, 174 ZB

[56] References Cited
UNITED STATES PATENTS

| | | |
|---|---|---|
| 3,786,449 | 1/1974 | Jauvtis .......................... 340/174 FB |
| 3,786,451 | 1/1974 | Spain ........................... 340/174 FB |
| 3,889,246 | 6/1975 | Battarel ........................ 340/174 TF |
| 3,893,089 | 7/1975 | Almasi et al. ................. 340/174 TF |

Primary Examiner—James W. Moffitt
Attorney, Agent, or Firm—Sughrue, Rothwell, Mion, Zinn & Macpeak

[57] ABSTRACT

The invention comes within the field of digital memories having thin magnetic layers, for the propagation of domains. This memory is constituted by an anisotropic linear magnetic channel which is applied on a glass substrate and which has a single shift conductor in a Greek border configuration superimposed on it. Areas made of soft magnetic material are provided at the intersection between the channels and the conductors. According to such a structure, high-capacity shift registers which are of relatively rapid access (one shift step lasts about 500 nanoseconds) can be produced.

8 Claims, 5 Drawing Figures

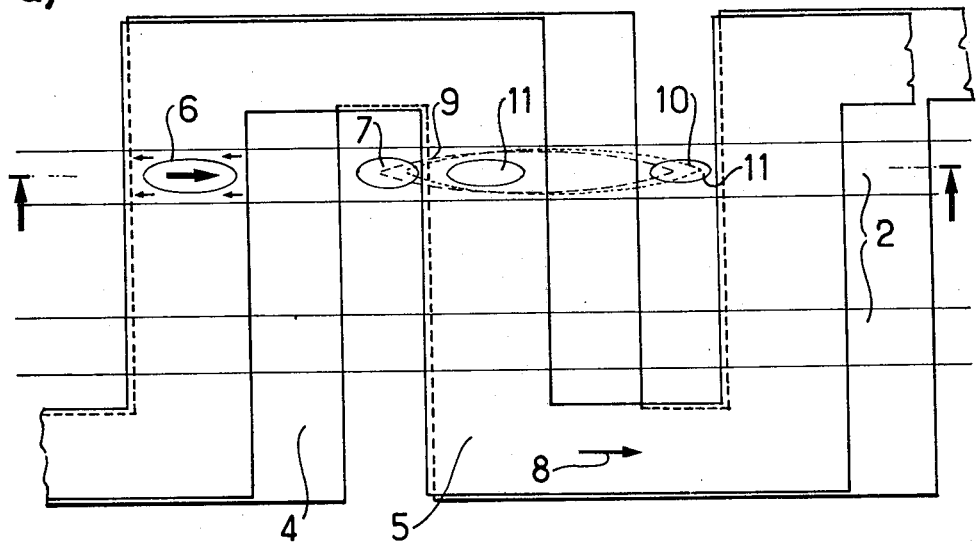
FIG.1
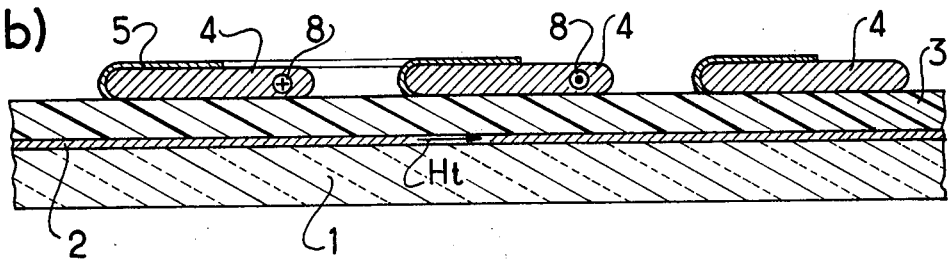
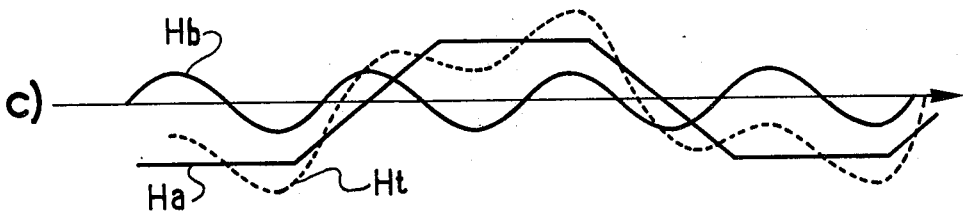
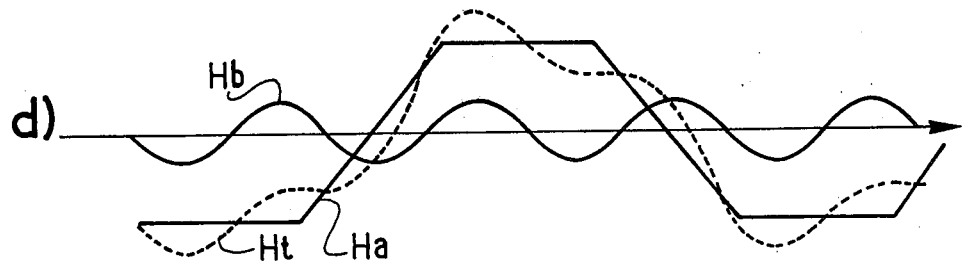

REGISTER FOR THE PROPAGATION OF MAGNETIC DOMAINS IN THIN MAGNETIC LAYERS

The invention refers to digital computers and more particularly to high-density memories according to the thin magnetic layer technique.

For several years, now, it is known that the thin magnetic layer technique can be used for manufacturing shift registers (see for example U.S. Pat. No. 2,919,432). The use of magnetization domains which are anti-parallel to a general magnetization direction confined in the defined zones of a thin ferromagnetic layer having uniaxial anisotropy has enabled the producing of various configurations of shift registers.

Nevertheless, an ever greater simplification of the structure both from the point of view of the form of the magnetic channels and of the energizing conductors as from that of the multiplicity and nature of the superimposed layers is desirable to obtain a greater density of storage of the data, higher performances and ease of manufacturing making the device attractive for the manufacturers and for the user.

It has been sought more particularly to produce structures which require, for effecting the synchronized advance of the domains, only a single conductor, exclusive of any other circuit, whereas many earlier techniques require, for the same advance function, either at least two conductors, or windings outside the substrate.

The invention therefore aims at simplifying and improving known shift registers as they are described for example in the periodical IEEE TRANSACTIONS ON MAGNETICS, Vol. MAG-6, No 3, September, 1970, pages 451 to 463.

The magnetic domain propagation register according to the invention, effecting the propagation of magnetic domains under the effect of electric currents in a channel formed by a strip of soft anisotropic magnetic substance deposited on an insulant substrate, is characterized in that it comprises a conductor having a sinuous or Greek border configuration extending along the said strip forming a propagation channel, an insulant layer being interposed therebetween, areas of soft magnetic substance partly covering the width of the sections of the said conductor having a Greek border configuration which are perpendicular to the easy magnetization axis at right-angles to a channel.

To great advantage, the areas which are superimposed on the said sections have a dimension in the direction of the propagation channel which is slighter than the width of the section at that point and they are situated eccentrically in relation to the axis of the section.

These areas can even extend partly beyond an edge of the conductor if manufacturing is thereby made easier.

To obtain a high-capacity memory, several channels in parallel are provided on the same substrate, these being intersected by the same conductor having a Greek border configuration, at least two areas covering partly the intersections on the same section of the conductor being merged perpendicularly with the easy axis of magnetization.

As these areas fulfill a function practically only at the intersections between the channels and a segment, they can be merged with other areas connected with a same section, so as to be able to use, for the forming of these areas, a mask which has the same geometrical shape as the conductors having a Greek border configuration, but that mask must be shifted in the axis of the channels by about half a width of the conductor at the points where the intersections are formed. The growth of the magnetic layer, whether it be chemical or electrolytic, occurs only on the conductor.

In a preferred embodiment of the invention, the conductors are completely covered by a hard magnetic layer and the areas of soft magnetic layer are applied to that layer. According to another characteristic of that preferred embodiment, the strips constituting the channels are thickened by a deposit of non-magnetic metal which is a good electrical conductor. This deposit can act as a writing or reading conductor as will be explained hereinbelow.

To great advantage, the intrinsic coercitive field of the channels has at least a factor five times smaller than that of the areas, the anisotropy fields of the channels and of the areas being of the same order of magnitude and in the same direction.

The invention will be described hereinafter with reference to several examples of embodiment which are shown in the figures.

FIG. 1a shows in a diagrammatic and simplified view a shift register according to the invention.

FIG 1b is a cross-section through the register according to FIG. 1a.

FIGS. 1c and 1d show the distribution of the magnetic field at the level of the channel in that register having two different operational instants.

Figure 2:
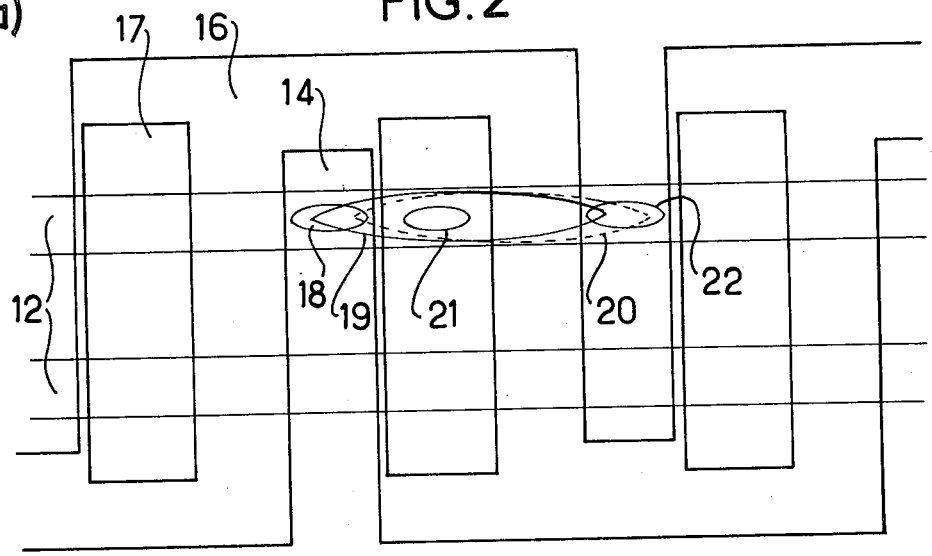
FIG. 2a shows a view of another embodiment of the register according to the invention.
FIG. 2b shows a cross-section through that register.
FIGS. 2c and 2d show the magnetic fields at the level of the channel in that register, at two different operational instants.
FIG. 2e shows the valid combined hysteresis loop in this register.
Figure 2:
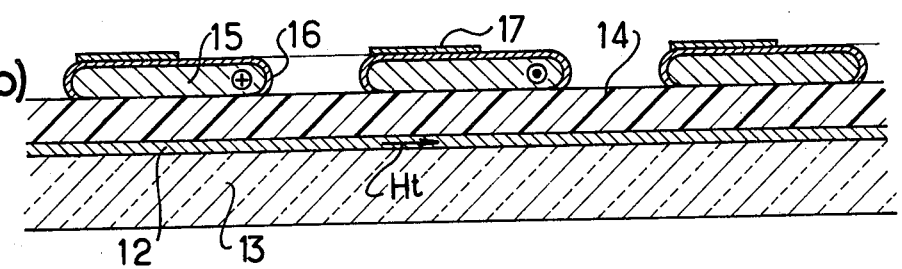
Figure 2:
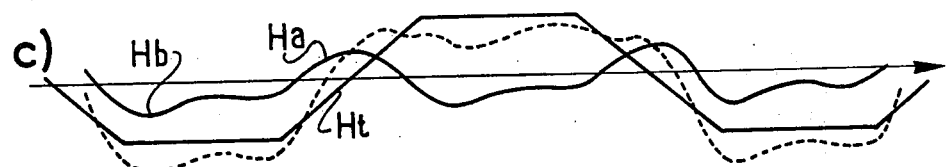
Figure 2:
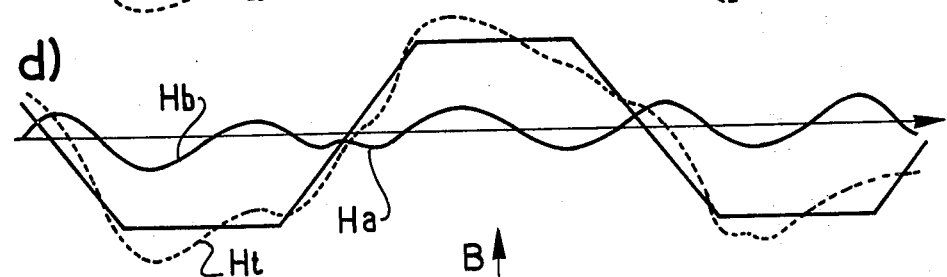
Figure 2:
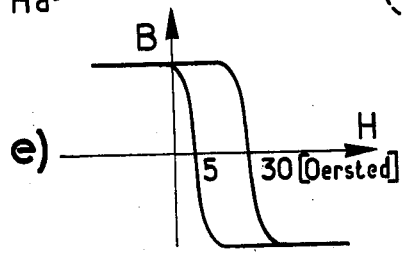

With reference to FIG. 1a and to FIG. 1b, it will be seen that the register is applied in thin layers on a glass substrate 1. In the first instance, a soft magnetic layer is deposited in a parallel strip pattern. During that depositing, a magnetic field of about 50 Oersteds is applied parallel to the axis of the strips inducing a uniaxial anisotropy whose easy axis is parallel to the field applied during the depositing. Each of the strips constitutes a propagation channel 2.

The definition of the strips may be obtained for example by a chemical deposit of a ferromagnetic alloy having a low coefficient of residual magnetostriction, containing mainly cobalt and nickel at the points where the glass is catalysed by successive dipping in tin chloride and palladium chloride solutions. Zones of photosensitive resins prevent catalysis outside the channels at places where depositing should not be effected. Such a layer can also be deposited by electrolysis or by evaporation in a vacuum.

A soft layer suitable for use will have a thickness of 1000 and, as its magnetic parameter, an intrinsic coercitive field Ho of 2 Oersteds and an anisotropy field Hk of 30 Oersteds. The value of the propagation threshold in a channel of 8 microns thus having a width of about + 8 Oersteds, the value of the deleting field of a domain in such a channel will depend on the length of the domain and will be about + 2 Oersteds for a domain which is 20 microns long.

These propagation channels may then be thickened by the electrolytic deposit of a non-magnetic metal which is a good conductor of electricity such as gold or copper down to a thickness of about 6 microns, except at the place kept for reading.

An insulant such as a high thermostable polymer for example a polyimide, is then spread onto the set of strips; its thickness, about 10 microns, must be as slight as possible to obtain a good field efficiency for the current applied, but nevertheless sufficient for obtaining an insulation without any defect all over the surface of the substrate and a fairly slight capacity making it possible to reduce to a minimum the electronic control circuitry. That insulating layer bears the reference 3.

A shift conductor 4 is then deposited for example by electrolysis of copper in the spaces left open in a layer of insulated photosensitive resin in a mask. This conductor has a sinuous or Greek border configuration and intersects the channels at regular distances by its sections perpendicular to the axes of the channels as seen in FIG. 1b.

Lastly, a deposit of a magnetic alloy completes the structure. That external magnetic layer is deposited for example by electrolysis in masses of photosensitive resins. More particularly, it is possible, without disturbing the operation of the registers, to deposit that magnetic layer beyond the strips on the elbows of the Greek border patterns of the shift conductor and consequently to effect the depositing of the magnetic layer, using the same mask as that which is used for depositing the shift conductor which is however shifted by half a width of the conductor. It is this configuration which is shown in FIGS. 1a and 1b where that layer bears the reference 5. It should be stated that the growth of the magnetic layer, if the deposit is formed electrolytically or chemically, occurs only on the conductor.

That magnetic layer 5 constitutes the set of areas whose operation will be described in greater detail hereinbelow and which is partly superimposed on the zones of intersection between the conductor 4 and the channel 2. The thickness of that layer is about 3000 and it comprises mainly nickel and cobalt. Its composition is nevertheless different from that of the channels, so as to obtain, as the magnetic parameter, approximately an intrinsic coercitive field Hc of 40 Oersteds and an anisotropy field Hk of 30 Oersteds.

That register operates as follows: a data bit is originally represented by two domains 6 and 7 in FIG. 1a. The domain 6 which is beneath the conductor 4 and the area 5 is not indispensable to operation, whereas the other domain 7 which is beneath the interstice between two conductors 4 bears the data. FIG. 1c shows at Ha the profile of the magnetic field along a channel 2 due to the flow of a current in the shift conductors 4 in the direction shown by an arrow 8 seen from the front in FIG. 1b in the middle conductor and seen from behind in the left-hand conductor. Hb represents the profile of the magnetic field applied along the same channel due to the magnetic charges existing on the edge of the areas 5 deposited on the shift conductors.

Ht represents the component parallel to the easy axis of the whole field applied on the magnetic propagation channel (Ht identical to Ha + Hb at all points of the channel). The growth and decrease mechanism of the domain is controlled by the general properties of the domain in the thin magnetic layers such that a domain grows in the whole zone of the channel where the whole field Ht exceeds the growth threshold of 8 Oersteds; it disappears in all zones of the channel in which the whole field Ht becomes less than the deletion threshold of 2 Oersteds and no further domain can be formed when the whole field Ht remains less than the longitudinal nucleation field close to 60 Oersteds due to the combined fact of the magnetic anisotropy and of the anisotropy of configuration of the channel.

When there is no current in the shift conductor 4, Ha is zero at all points of the channel and Ht is identical to Hb according to FIG. 1c.

When a current is sent in the conductor 4, a magnetic field whose profile along the channel is shown at Ha in FIG. 1c is developed and is superimposed on the magnetic field Hb. The compound field Ht is shown in FIG. 1c in discontinuous lines.

When the field Ha reaches 20 Oersteds, that is, about twice the amplitude of the field Hb set up by area 5, the domain 6 to the left of FIG. 1a is deleted under the effect of the negative field Ht; on the other hand, the right-hand domain 7 grows as shown by the discontinuous line 9 in FIG. 1a.

If the current in the shift conductor continues to increase, the area having an anisotropy field Hk of 30 Oersteds commutates, when the field Ha applied to the channel changes over from 20 to 30 Oersteds. At that instant, the field at the level of the shift strip reaches 36 Oersteds. A coercitive field for areas of 40 Oersteds makes it possible to avoid the presence of the demagnetizing domains on the edges which could, for a slighter Hc, be sufficiently great to disturb the field set up by the area. After that commutation of the area, the field Ht follows the profile which is shown in FIG. 1d and the trace of the domain is shown by the discontinuous line 10 in FIG. 1a.

The current remains at that value during a time sufficient for the domain to take up effectively the position shown by the line 10 in FIG. 1a. For a width of shift conductor of 50 microns, that time is at least equal to 100 nanoseconds. Then, the current decreases until it reaches an amplitude of zero; only the field applied by the magnetic area 5 shown by the profile Hb of FIG. 1d remains. Simultaneously, the magnetic domain grows towards the right up to the point where the field applied by the area falls below a growth threshold of 8 Oersteds and it is seleted in its central part at the place where the field applied becomes less than 2 Oersteds, along the profile Hb in FIG. 1d. Therefore, the two domains shown at 11 in FIG. 1a, where it is apparent that the domains bearing data have been shifted exactly by a half-step of the structure of the shift conductor subsist.

At the following clock phase, the current reverses to reach also an amplitude which corresponds to a field Ha of 30 Oersteds. The magnetization of the areas being reversed at the preceding clock phase, the situation of the fields applied is similar but shifted by a half-step and is therefore identical with respect to the domains, which are also shifted by a half-step. The advance mechanism is therefore similar and the domains advance by a second half-step, thus effecting a whole advance step.

It will therefore be seen that a bit can be recorded at each step in a channel. The writing and reading devices necessary for nucleating a domain and for extracting the data of the channel can be of any known kind such as, for example, that based on inductive or galvanomagnetic effects (for example Hall effect). It is evident that a very great number of parallel channels on which data advances in parallel under the control of the single shift conductor can be provided on a substrate. It is also possible to combine two channels in relation to a single data source and a single processing device by recording alternately at each half-step the data on one of the channels or the other. Thus, the binary flow is doubled at the input and at the output.

Turning now to FIG. 2, which shows another embodiment of the invention whose general structure resembles that of FIG. 1, it will be seen in FIG. 2b that the propagation channel 12 is applied on a glass substrate 13 and that this assembly, as in the preceding case, is covered with a layer of insulant 14 on which is applied the shift conductor 15. But contrary to the preceding case, that conductor is covered here with a hard magnetic layer 16, for example a cobalt alloy having a high coercitive field and a soft layer, for example a nickel-cobalt alloy having a low intrinsic coercitive field, 2 to 5 Oersteds, is then deposited, through a photosensitive resin as in FIG. 1. The result of coupling the hard and soft layers constituting the areas is that the shysteresis cycle is displaced as in FIG. 2e. The commutation being effected essentially by rotation of the magnetization of the soft layer urged by the return torque of the exchange coupling with the hard layer which does not commutate, the forming of demagnetizing domains on the edges of the areas is thus avoided. Moreover, the forming of these coupled layers can be more easy than that of the simple area in FIG. 1 which requires magnetic characteristics which are more difficult to obtain from usual alloys.

When a pulse is applied to the conductor 15, it is observed that, according to FIG. 2a, a domain 18 bearing data takes up successively the positions 19 and 20 which correspond to the positions 9 and 10 according to FIG. 1. Then, when the pulse decreases, two domains 21 and 22 are generated, these corresponding to the domains 11 according to FIG. 1 and lastly, when the current becomes zero, the domain 21 disappears under the effect of the hard layer 16. The profile of the field due to the areas is still Hb between two pulses of the shift current. As in the preceding case, for one half-step, there must be a pulse of one polarity and for the other half-step, there must be a pulse of the other polarity.

FIGS. 2c and 2d show, in a like manner, as in FIGS. 1c and 1d, the profiles of the magnetic fields in the embodiment according to FIGS. 2a and 2b.

Figure 3:
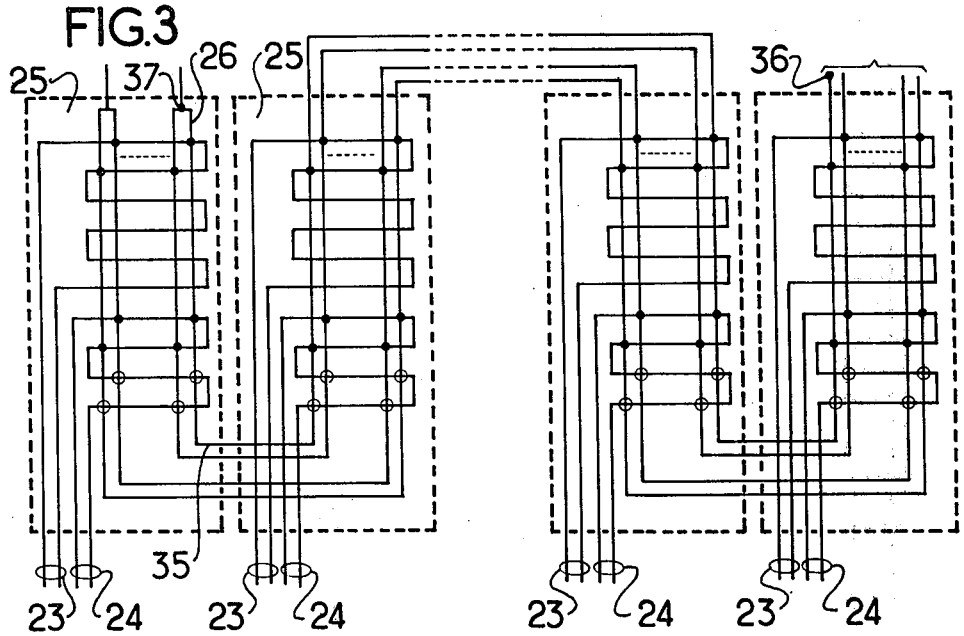
FIG. 3 shows a possible configuration of a multiplex register.

The two channels per register configuration having two phases mentioned hereinabove can be put to profit to produce a high-capacity memory having a rapid access time. FIG. 3 illustrates a possible arrangement of the registers on a substrate. Operation is effected over 16 bits in parallel, a selectable register being constituted by 16 pairs of vertical sections of the channels. These latter, being joined together at their ends, constitute 16 double digit lines for the whole of the substrate. The advance current is sent only to the selected register. The shift conductor of each register is separated into two distinct conductors: a long one and a short one 23 and 24. For reasons of simplicity, the long conductor represents registers having six steps or 12 bits, whereas the short register contains two steps or four bits. In actual fact, for substrates having a useful length of 5 cm., it is possible to obtain 1024 steps or 2048 bits for all of them, whereas the short register can comprise 64 steps.

In a two-phase register, the step corresponds to a width of the shift conductor and to a clock time about 500 nanoseconds. The shift current can therefore be sent either into the set of long and short conductors, or into the short conductor only and thus operate a long register having 1024 steps or a short register having 64 steps situated near to the reading station. During normal operation of such memories, the data required is in most cases in the short part, so that the average access time is in the order of magnitude of the total access of the short part, that is 32 microseconds in the case of the example mentioned.

For reasons of simplicity in the illustration, FIG. 3 does not show the various layers of substrate, but only the shift conductors 23 and 24 for 16 different register units 25 which can be found all on a same substrate. Each channel is here represented by an electrical conductor such as, for example, 26, which is, in actual fact, superimposed on the magnetic channel as has been mentioned previously. These conductors 26 are connected together in series from one substrate to the next by conductors 35. The conductors 26 constitute the writing and reading circuits for the units. On the intersections with the shift conductor which are blackened, this circuit is coupled to the channel for writing and at the encircled intersection, it is coupled for reading. This arrangement of conductors leads, by a terminal 36, to a reading amplifier common to a bit in all the units of the register.

Figure 4:
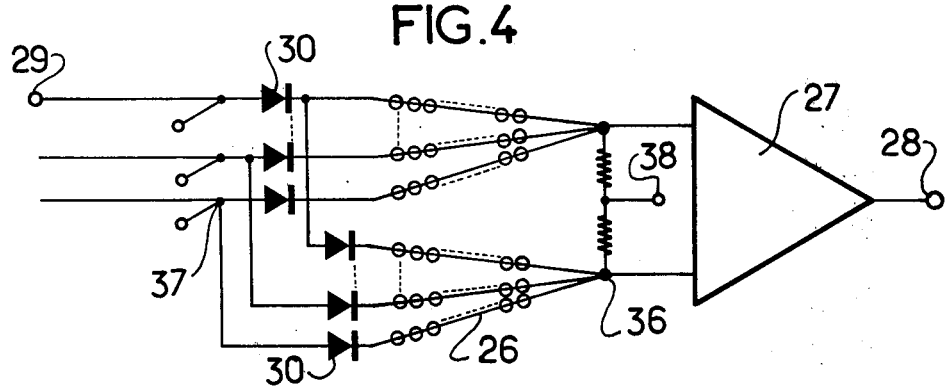
FIG. 4 shows the electrical writing and reading structure of the configuration according to FIG. 3.

FIG. 4 shows the electric diagram of that structure with the differential amplifier 27 which sends out, at its output 28, a sequence of bits coming from a pair of channels of a unit selected by the presence of the pulses on the corresponding shift conductor (23 and/or 24). The conductor 26 according to FIG. 3, which is coupled to a reading station in each of the 16 units 25 is here seen again. The two conductors such as 26 belonging to a pair of channels are fed for writing by a common data source which is connected to an input 29 through two non-return and decoupling diodes 30. Sixteen pairs of channels with 16 distinct sources of binary data and 16 pairs of diodes in parallel can be provided.

The reading amplifier 27 has its inputs polarized by a voltage applied to the terminal 38.

A train of binary data which is applied to a pair of channels is connected up through a junction point such as 37 (FIGS. 3 and 4) to one of the two channels of the pair as a function of the energizing of the corresponding writing station (black points in FIG. 3).

It will be seen that the memory block described uses only 16 register units and 16 reading amplifiers, this giving, on 16 different substrates, a capacity of four megabits and a flow rate of 32 megabits per second.

Figure 5:
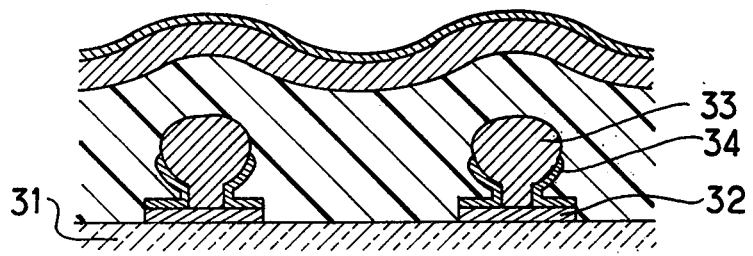
FIG. 5 shows yet another embodiment of a register according to the invention in a cross-section view.

Lastly, FIG. 5 shows a possible variant of the structure of the channels which is, more particularly, characterized in that the depositing of the soft layer is effected evenly over the whole of the substrate, then a mass of photosensitive resin defines the channels and enables the electrolytic growth of a reading and writing conductor having a thickness of about 8 microns which will overlap by about 4 microns on either side of the channel. The glass substrate is shown by the reference 31; the soft even layer is shown by 32 and the conductor is shown by 33. The resin is then dissolved and a deposit of hard layer 34 essentially of 600 of cobalt, either chemical or electrolytic, is effected on the substrate taken as a whole. The magnetic layers between the channels and possibly on the conductors remain to be removed. This may be done in two ways:

a. A first way consists in effecting directly an ionic engraving in a direction perpendicular to the plane of the substrate which will remove the hard layer from the conductors and the set of hard and soft coupled layers from between the conductors and the channels while keeping these magnetic layers beneath the conductors and in the shade borne by the conductors.

b. A second way consists in spreading a positive photosensitive resin which, by capillarity, fills in the parts situated in the hollow portions beneath the edges of the conductor of the channel. On the insulation of the resin, these relatively thick parts will not be exposed and will therefore be preserved from the engraving. The engraving bath could be selective in relation to the metal constituting the conductors to preserve the integrity thereof. This structure of the channel has the advantage of not requiring a localized deposit of the first layer on the glass and the removal of the magnetic charges which could result from magnetic and geometrical imperfections of the edges of the active part of the channel.

Then an insulating layer in applied as shown in FIG. 1 at reference 3 and the structure is ended as previously.

The register according to the invention is distinguished from the registers described in the above-mentioned documents by the simplicity of the geometrical shapes and, consequently, by the ease with which it is manufactured. This ease makes it possible to design structures at a reduced scale and hence to increase the density of the memory. From the point of view of operation, the absence of magnetic fields outside the thin layers will be observed, a single conductor ensuring the shifting of the hits in the register.

I claim:

1. A magnetic thin film shift register of the type in which magnetic domains are propagated, under the effect of electric currents, along a channel formed by a first strip of soft anisotropic magnetic material deposited on an insulating substrate, said register comprising:

a. a sinuous shift conductor extending along the length of the strip and having vertical sections perpendicular to the length of the strip and repeatedly crossing over the strip;
    b. an insulating layer between the strip and said shift conductor; and
    c. a first layer of soft magnetic substance overlying each of said conductor sections at least at the point of cross-over thereof with the strip, but overlying less than the entire width of the section, said width being in the same direction as the length of the strip.

2. Register according to claim 1 wherein the intrinsic coercive field of said channel has a factor at least 5 times smaller than that of said first layer, the anisotropy fields of said channel and of said first layer having the same order of magnitude and the same direction.

3. A register according to claim 1 wherein said first layer of soft magnetic substance is eccentrically located with respect to the vertical axes of said sections of said shift conductor.

4. A register according to claim 1 comprising a hard magnetic layer completely covering said shift conductor and disposed between the shift conductor and said first layer of soft magnetic substance.

5. A register according to claim 1 further comprising domain read/write means coupled to the channel formed by the strip.

6. A register according to claim 1 and further comprising a second strip of soft anisotropic material parallel to said first strip and forming another propagation channel, wherein each of said vertical sections of said shift conductor overlies both of the strips, and wherein said first layer of soft magnetic substance overlies the cross-over points of each section with both of said strips.

7. A shift register according to claim 6 wherein said first layer is also sinuous, like said shift conductor, wherein the vertical sections of said first layer are about one-half as wide as those of said shift conductor, and wherein said first layer is shifted about one-half the width of a shift conductor vertical section at the points of cross-over.

8. A register according to claim 6 comprising a domain read/write electrical conductor of a non-magnetic material and formed on each of said first and second strips.

* * * * *